United States Patent
Tsaur et al.

(10) Patent No.: US 10,608,429 B2
(45) Date of Patent: Mar. 31, 2020

(54) ELECTRO-STATIC DISCHARGE PROTECTION CIRCUIT

(71) Applicant: REALTEK SEMICONDUCTOR CORPORATION, Hsinchu (TW)

(72) Inventors: Tay-Her Tsaur, Tai-Nan (TW); Cheng-Cheng Yen, Hsinchu (TW); Chien-Ming Wu, Hsinchu County (TW); Cheng-Pang Chan, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 349 days.

(21) Appl. No.: 15/476,169

(22) Filed: Mar. 31, 2017

(65) Prior Publication Data

US 2017/0324239 A1   Nov. 9, 2017

(30) Foreign Application Priority Data

May 9, 2016 (TW) .............................. 105114262 A

(51) Int. Cl.
*H02H 9/04* (2006.01)
*H01L 27/02* (2006.01)

(52) U.S. Cl.
CPC ........... *H02H 9/04* (2013.01); *H01L 27/0285* (2013.01)

(58) Field of Classification Search
CPC ........... H02H 9/04–06; H02H 3/04–08; H02H 3/087; H02H 7/20
USPC ....... 361/91, 43–56; 327/309, 312–313, 321, 327/178–180
See application file for complete search history.

(56) References Cited

U.S. PATENT DOCUMENTS

| | | | |
|---|---|---|---|
| 5,862,031 A | 1/1999 | Wicker et al. | |
| 6,342,722 B1 | 1/2002 | Armacost et al. | |
| 6,385,116 B2 | 5/2002 | Wang | |
| 6,448,123 B1 | 9/2002 | Lee et al. | |
| 6,507,471 B2 | 1/2003 | Colclaser et al. | |
| 6,507,828 B1 * | 1/2003 | Leonard ................. | G06N 3/063 706/33 |
| 6,661,060 B2 | 12/2003 | Lee et al. | |
| 6,690,557 B2 | 2/2004 | Hung et al. | |
| 6,693,780 B2 | 2/2004 | Spehar et al. | |
| 6,731,488 B2 | 5/2004 | Voldman | |
| 6,882,224 B1 | 4/2005 | Gaboury et al. | |

(Continued)

FOREIGN PATENT DOCUMENTS

CN          1501561 A      6/2004

OTHER PUBLICATIONS

OA letter of the counterpart CN application (appl. No. 201610313322.0) dated Jan. 18, 2019. Summary of the CN OA letter: Claims 1, 4, 8 are rejected as being anticipated by the cited reference US20020071230A1. Claims 2-3, 7 are rejected as being unpatentable over the cited reference US20020071230A1 in view of the existing arts of this industrial filed.

*Primary Examiner* — Tuan T Dinh
(74) *Attorney, Agent, or Firm* — WPAT, PC

(57) ABSTRACT

This disclosure provides an ESD protection circuit coupled to a first and a second terminals of a differential-pair circuit. The ESD protection circuit includes: an ESD sensing unit coupled to the first and the second terminals and sensing electrical changes at the first and the second terminals to generate a first trigger signal; and a first discharging unit coupled to the ESD sensing unit and turning on a first discharging path according to the first trigger signal.

9 Claims, 5 Drawing Sheets

(56) References Cited

U.S. PATENT DOCUMENTS

| | | | |
|---|---|---|---|
| 7,170,727 B2 | 1/2007 | Richardson | |
| 7,276,953 B1 * | 10/2007 | Peng | H03K 19/018528 |
| | | | 326/63 |
| 7,579,881 B2 | 8/2009 | Bach | |
| 2002/0071230 A1 | 6/2002 | Colclaser et al. | |
| 2006/0268479 A1 | 11/2006 | Bischof | |
| 2007/0052395 A1 * | 3/2007 | Belch | H02M 3/1582 |
| | | | 323/222 |
| 2008/0304191 A1 * | 12/2008 | Riviere | H01L 27/0285 |
| | | | 361/56 |
| 2014/0211350 A1 * | 7/2014 | Cox | H02H 9/046 |
| | | | 361/56 |
| 2015/0061756 A1 * | 3/2015 | Sewani | H03K 19/018521 |
| | | | 327/538 |
| 2015/0162746 A1 * | 6/2015 | Ikeda | H02H 9/046 |
| | | | 361/56 |
| 2018/0175606 A1 * | 6/2018 | Giacomini | H02H 3/04 |

* cited by examiner

ELECTRO-STATIC DISCHARGE PROTECTION CIRCUIT

BACKGROUND OF THE INVENTION

1. Field of the Invention

The present invention relates to an electro-static discharge protection circuit.

2. Description of Related Art

The output/input terminal of an electronic circuit element will unavoidably suffer an unpredictable influence of electro-static discharge (ESD). Such ESD influence is originated from rapid, transient and high-voltage energy and may cause damage to circuits. Therefore, an ESD protection is important to the design of electronic circuit element. In order to deal with ESD problems, many kinds of ESD protection circuits are applied to the design of electronic circuit element so as to provide discharging paths for ESD current bypassing protected circuits, which therefore prevent the protected circuits from damage. Tests such as an ESD test, a system-level ESD gun test, an electrical fast transient test, and a surge test are commonly used in this field.

However, a generally known ESD protection circuit has some problems in the design of ESD energy discharging path. In addition, an ESD protection circuit capable of being integrated into a differential-pair circuit will become popular in the future.

SUMMARY OF THE INVENTION

In consideration of the problems of the prior art and the trend of the future development, an embodiment of the present invention provides an electro-static discharge (ESD) protection circuit coupled to a first terminal and a second terminal of a differential-pair circuit. The ESD protection circuit comprises: an ESD sensing unit being coupled to the first and the second terminals, and sensing electrical changes at the first and the second terminals to generate a first trigger signal; and a first discharging unit being coupled to the ESD sensing unit, and turning on a first discharging path according to the first trigger signal.

In an embodiment of the present invention, the aforementioned ESD sensing unit includes: a common mode voltage unit generating a common mode voltage according to the electrical changes at the first and the second terminals; and a comparator comparing the common mode voltage and a reference voltage and thereby generating the first trigger signal.

In an embodiment of the present invention, the aforementioned common mode voltage unit is a voltage divider including two resistors connected in series.

In an embodiment of the present invention, the aforementioned first discharging unit is coupled to the first and the second terminals, and the first and the second terminals are short-circuited when the first discharging unit turns on the first discharging path according to the first trigger signal.

In an embodiment of the present invention, the ESD protection circuit further comprises: a second discharging unit being coupled to the first terminal and a grounding terminal, and turning on a second discharging path to ground the first terminal when the second discharging unit receives a second trigger signal that is generated by the ESD sensing unit sensing the electrical changes at the first and the second terminals, wherein the first discharging unit is coupled to the second terminal and the grounding terminal, and grounds the second terminal by turning on the first discharging path according to the first trigger signal.

In an embodiment of the present invention, the ESD protection circuit further comprises: a third discharging unit being coupled to the first and the second terminals, and turning on a third discharging path to make the first and the second terminals short-circuited when the third discharging unit receives a third trigger signal that is generated by the ESD sensing unit sensing the electrical changes at the first and the second terminals.

In an embodiment of the present invention, the aforementioned ESD sensing unit further includes a second comparator configured to compare the common mode voltage with a second reference voltage and thereby generate a second trigger signal.

In an embodiment of the present invention, the aforementioned first discharging unit is selected from at least one of the follows: at least one MOSFET, at least one BJT, at least one silicon-controlled rectifier (SCR), or other electronic elements.

In an embodiment of the present invention, the aforementioned first trigger signal, the second trigger signal and the third trigger signal are one and the same.

In an embodiment of the present invention, the aforementioned first trigger signal, the second trigger signal and the third trigger signal are different signals.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this industrial field. If any term is defined in this specification, such term should be explained accordingly.

Figure 1:
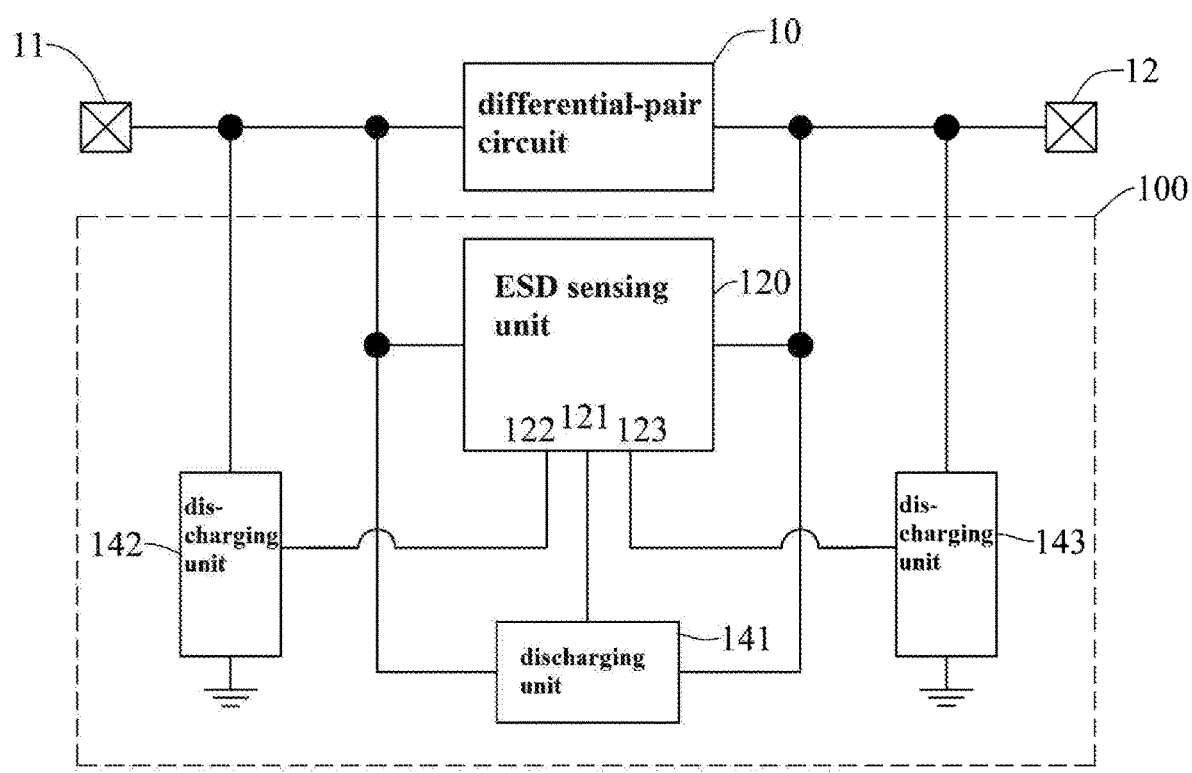
FIG. 1 illustrates an embodiment of the ESD protection circuit according to the present invention.

FIG. 1 illustrates an embodiment of the electro-static discharge (ESD) protection circuit according to the present invention. The ESD protection circuit 100 is coupled to a first terminal 11 and a second terminal 12. The first terminal 11 and the second terminal are input terminals of a differential signal, and are usually connected to pads of an integrated circuit. The signals at the first terminal 11 and the second terminal are usually complementary, and pertain to the said differential signal. The differential-pair circuit 10 processes the differential signal come from the first terminal 11 and the second terminal 12, and then outputs the processed signal to a load circuit (not shown in the figure).

As shown in FIG. 1, the ESD protection circuit 100 comprises an ESD sensing unit 120, a discharging unit 141, a discharging unit 142 and a discharging unit 143. In other embodiments, the amount and setting of the discharging unit(s) are not limited to the embodiment of FIG. 1; in other words, there may be only one or two discharging unit(s). The ESD sensing unit 120 includes two input terminals which are connected to the first terminal 11 and the second terminal 12 respectively and sensing electrical changes at the first terminal 11 and the second terminal 12. The said electrical changes could be changes of voltage, current or charges. When the electrical change(s) at the first terminal 11 and/or the second terminal 12 is/are violent, the ESD sensing unit 120 generates trigger signals 121, 122 and 123 to enable the discharging unit 141, the discharging unit 142 and the discharging unit 143, so that the ESD energy can be discharged through one or more suitable discharging path(s) immediately.

In this embodiment, the discharging unit 141 is coupled to the first terminal 11 and the second terminal 12, and receives the trigger signal 121 from the ESD sensing unit 120; the discharging unit 142 is coupled to the first terminal 11 and a grounding terminal, and receives the trigger signal 122 from the ESD sensing unit 120; the discharging unit 143 is coupled to the second terminal 12 and a grounding terminal, and receives the trigger signal 123 from the ESD sensing unit 120.

Figure 2:
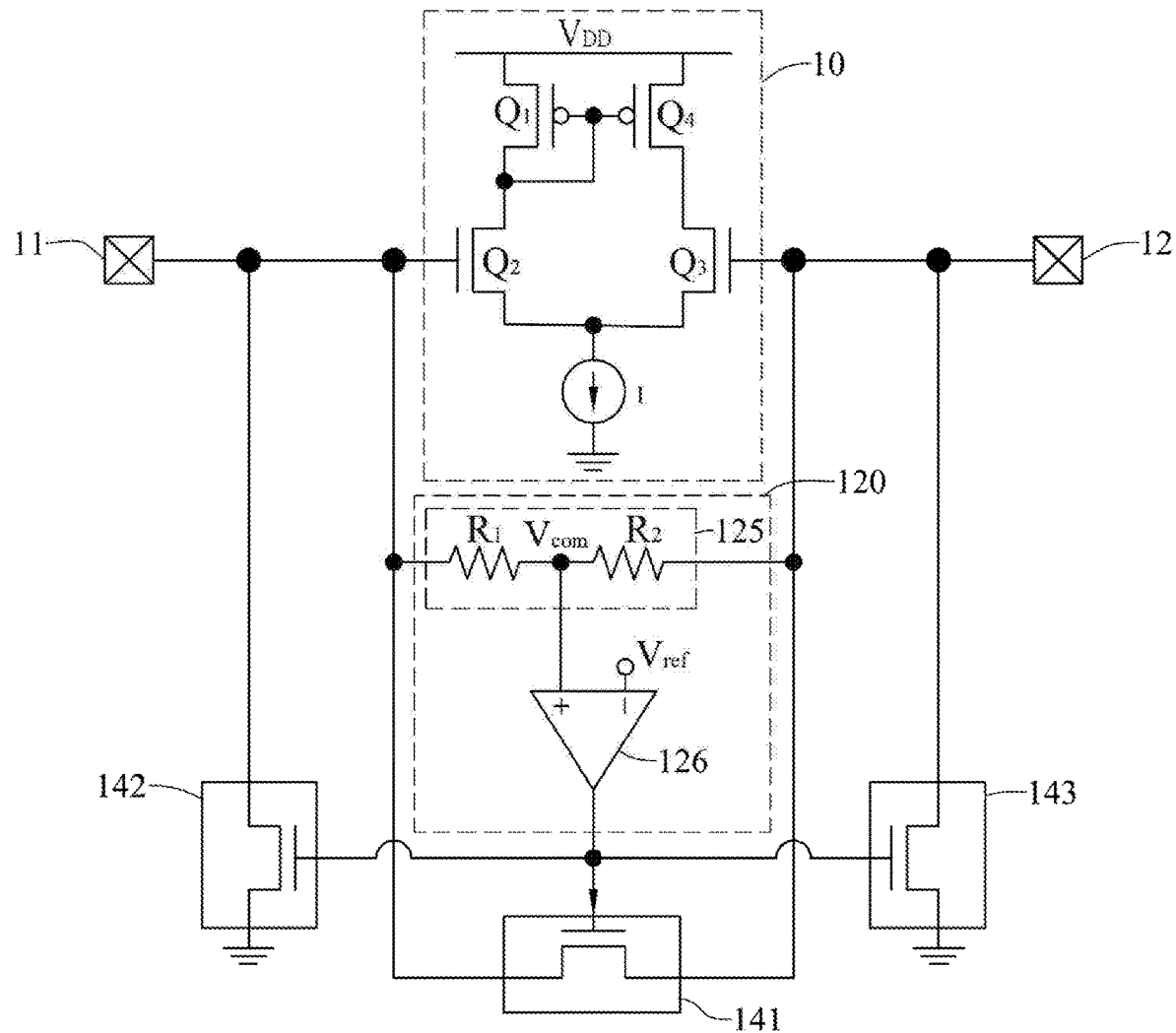
FIG. 2 is a circuit diagram of the embodiment of FIG. 1, in which the discharging unit is composed of transistors.

FIG. 2 is a circuit diagram of the embodiment of FIG. 1. In this embodiment, each of the discharging units 141, 142, 143 is composed of at least a transistor, and the gate of each transistor is coupled to the ESD sensing unit 120. When the electrical change(s) at the first terminal 11 and/or the second terminal 12 is/are sufficient to make the ESD sensing unit 120 generate the trigger signals, the discharging unit 141, the discharging unit 142 and the discharging unit 143 are turned on and three discharging paths are established. The discharging path established by the discharging unit 141 is operable to make the first terminal 11 and the second terminal 12 short-circuited (i.e., the path between the first terminal 11 and the second terminal 12 is short-circuited); the discharging path established by the discharging unit 142 is operable to ground the first terminal 11; the discharging path established by the discharging unit 143 is operable to ground the second terminal 12; therefore, the ESD energy can be discharged through these three discharging paths quickly.

In this embodiment, the ESD sensing unit 120 is realized with a common mode voltage unit 125 and a comparator 126, while the common mode voltage unit 125 is realized with a voltage divider composed of resistors $R_1$ and $R_2$ connected in series. In a preferred embodiment, the resistors $R_1$ and $R_2$ have the same resistance, the common mode voltage $V_{com}$ is the average of the voltages at the first terminal 11 and the second terminal 12. In other embodiments, the resistors $R_1$ and $R_2$ might have different resistance in consideration of circuit design requirements or setup of specific voltage level. When the common mode voltage $V_{com}$ is greater than the reference voltage $V_{ref}$, the comparator 126 generates a trigger signal. In this embodiment, the trigger signals for the discharging unit 141, the discharging unit 142 and the discharging unit 143 are one and the same. In other embodiments, the ESD sensing unit 120 may include a plurality of comparators operable to generate trigger signals in accordance with different thresholds, so as to allow the discharging unit 141, the discharging unit 142 and the discharging unit 143 to turn on their respective discharging paths according to their respectively received different trigger signals. It should be noted that each of the said discharging units is realized with at least one of the follows: at least one metal-oxide-semiconductor field-effect transistor (MOSFET); at least one bipolar junction transistor (BJT); at least one silicon-controlled rectifier (SCR); and other electronic elements that can be turned on quickly.

When the power source voltage $V_{DD}$ of the differential-pair circuit 10 is 3.3 volt, the reference voltage $V_{ref}$ could be set at 1.65 volt (i.e., $V_{DD}/2$). The comparator 126 compares the common mode voltage $V_{com}$ with the reference voltage $V_{ref}$. When the common mode voltage $V_{com}$ is greater than the reference voltage $V_{ref}$, an ESD phenomenon occurring at the first terminal 11 and/or the second terminal 12 is suggested; meanwhile, the comparator 126 issues a trigger signal. In this embodiment, the comparator 126 is an operational amplifier; the differential-pair circuit 10 is composed of four transistors $Q_1$, $Q_2$, $Q_3$, $Q_4$ and a current source I as typical design of analog internal circuits.

Figure 3:
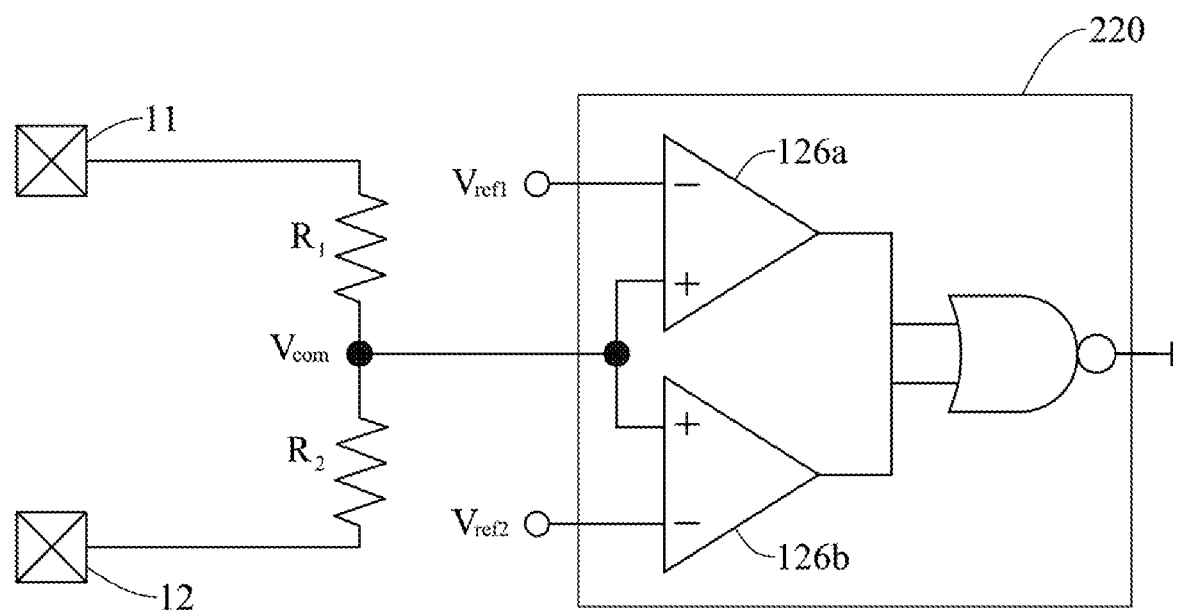
FIG. 3 is a circuit diagram of another embodiment of the ESD sensing unit.

FIG. 3 is a circuit diagram of another embodiment of the ESD sensing unit. The ESD sensing unit 220 includes comparators 126a and 126b which receive different reference voltages $V_{ref1}$ and $V_{ref2}$ respectively. In this configuration, when the common mode voltage $V_{com}$ exceeds the voltage range defined by the reference voltages $V_{ref1}$ and $V_{ref2}$, the ESD sensing unit 220 issues a trigger signal. In one embodiment, the reference voltage $V_{ref1}$ could be 1.15 volt (i.e., $(V_{DD}/2)-0.5V$) and the reference voltage $V_{ref2}$ could be 2.15 volt (i.e., $(V_{DD}/2)+0.5V$). The NOR gate of the ESD sensing unit 220 is well known and the detail is omitted.

Figure 4:
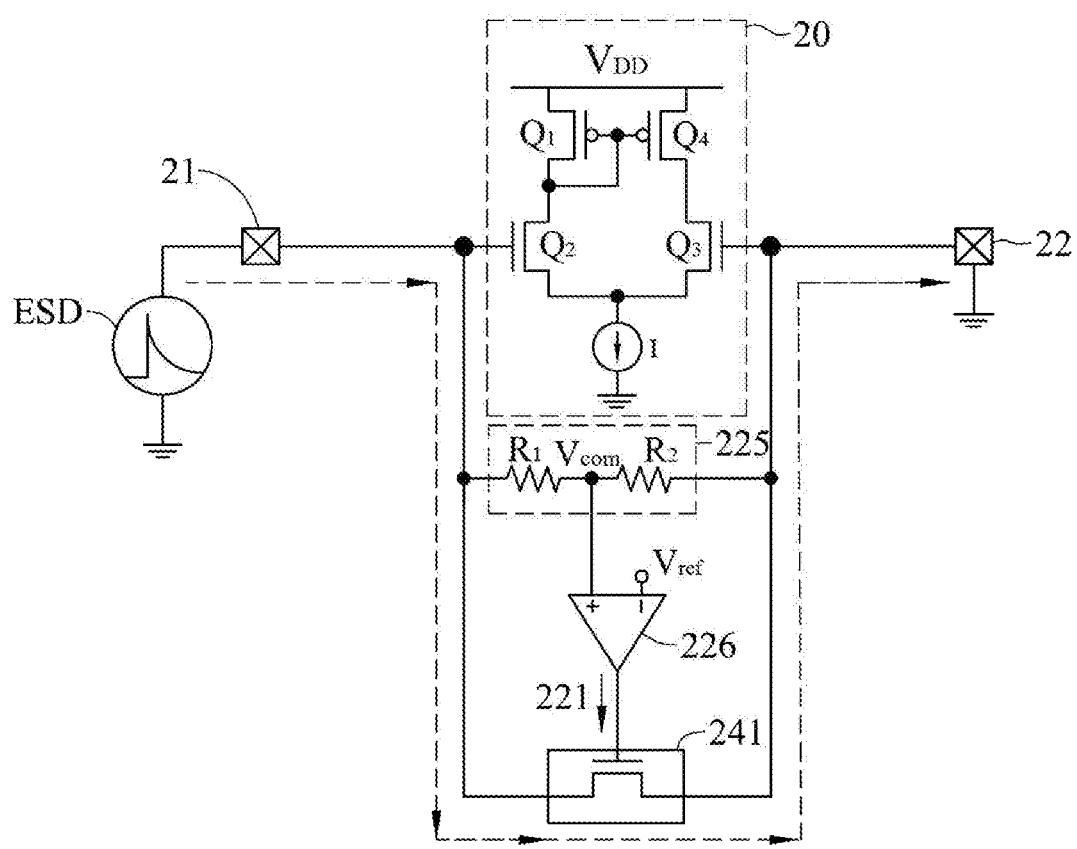
FIG. 4 illustrates another embodiment of the ESD protection circuit according to the present invention.

FIG. 4 shows a circuit diagram of another embodiment of the ESD protection circuit according to the present invention. When an ESD phenomenon of a differential-mode occurs at the first terminal 21, the common mode voltage $V_{com}$ from the common mode voltage unit 225 is greater than the reference voltage $V_{ref}$; accordingly, the comparator 226 generates a trigger signal 221 to turn on the FET of the discharging unit 241 and thereby establish a discharging path making the first terminal 21 and the second terminal 22 short-circuited (i.e., making the path between the first terminal 21 and the second terminal 22 short-circuited). The discharging path for transient current caused by ESD energy is illustrated by the dash line with arrows in the figure.

Figure 5:
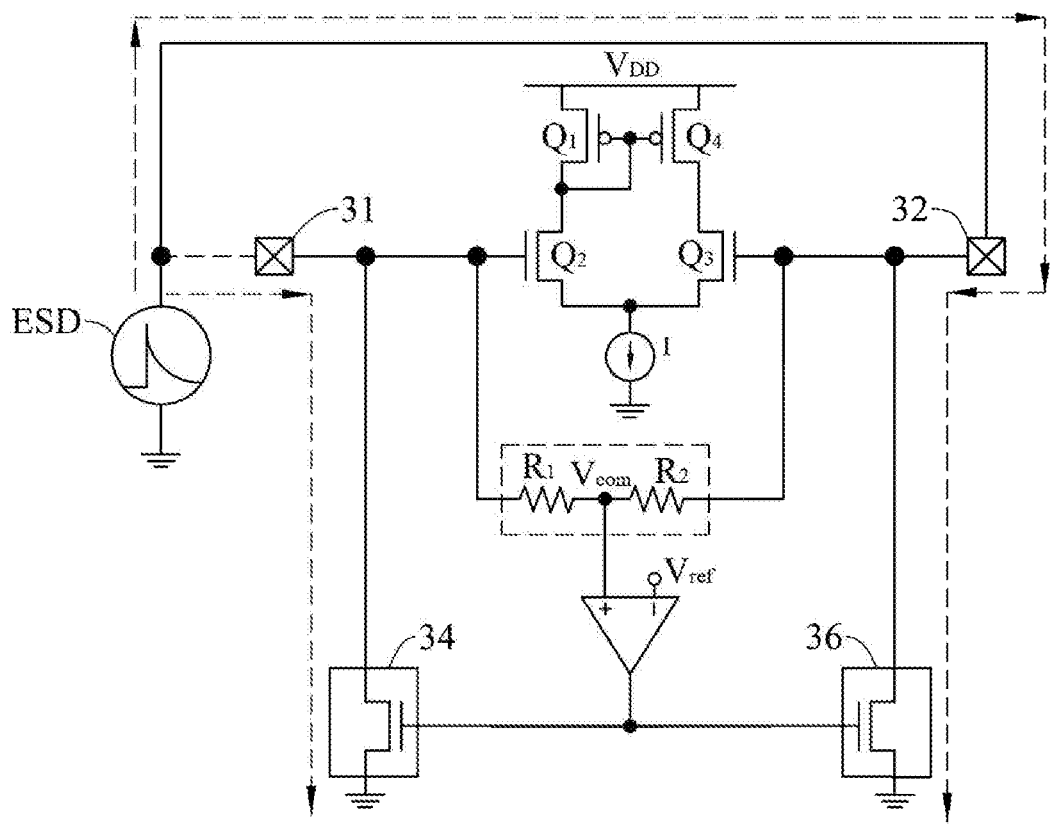
FIG. 5 illustrates a further embodiment of the ESD protection circuit according to the present invention.

FIG. 5 shows a circuit diagram of a further embodiment of the ESD protection circuit according to the present invention. In this embodiment, each of the discharging unit 34 and the discharging unit 36 is realized with at least a transistor. The source and drain terminals of the discharging unit 34 are coupled to the first terminal 31 and a grounding terminal respectively. The source and drain terminals of the discharging unit 36 are coupled to the second terminal 32 and the grounding terminal respectively. When an ESD phenomenon of a common-mode occurs at the first terminal 31 and the second terminal 32, the common mode voltage $V_{com}$ is greater than the reference voltage $V_{ref}$, and the gate of the discharging unit 34 and the gate of the discharging unit 36 receive trigger signals to turn on their paths between their drain terminals and their source terminals, so that two discharging paths are established as illustrated by the dash lines with arrows in the figure. The discharging paths ground the first terminal 31 and the second terminal 32.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An electro-static discharge (ESD) protection circuit coupled to a first terminal and a second terminal of a differential-pair circuit, the ESD protection circuit comprising:
- an ESD sensing unit being coupled to the first and the second terminals, sensing electrical changes at the first and the second terminals to generate a first trigger signal, and including:
  - a common mode voltage unit generating a common mode voltage according to the electrical changes at the first and the second terminals;
  - a first comparator comparing the common mode voltage and a reference voltage and thereby generating the first trigger signal; and
  - a second comparator configured to compare the common mode voltage with a second reference voltage and thereby generate a second trigger signal; and
- a first discharging unit being coupled to the ESD sensing unit, and turning on a first discharging path according to the first trigger signal,
- wherein the first terminal and the second terminal of the differential-pair circuit are terminals for receiving a differential signal.

2. The ESD protection circuit of claim 1, further comprising:
- a second discharging unit being coupled to the first terminal and a grounding terminal, and turning on a second discharging path to ground the first terminal when the second discharging unit receives the second trigger signal,
- wherein the first discharging unit is coupled to the second terminal and the grounding terminal, and grounds the second terminal by turning on the first discharging path according to the first trigger signal.

3. The ESD protection circuit of claim 1, wherein the common mode voltage unit is a voltage divider including two resistors connected in series.

4. The ESD protection circuit of claim 1, wherein the first discharging unit is coupled to the first and the second terminals, and the first and the second terminals are short-circuited when the first discharging unit turns on the first discharging path according to the first trigger signal.

5. An electro-static discharge (ESD) protection circuit coupled to a first terminal and a second terminal of a differential-pair circuit, the ESD protection circuit comprising:
- an ESD sensing unit being coupled to the first and the second terminals, and sensing electrical changes at the first and the second terminals to generate a first trigger signal;
- a first discharging unit being coupled to the ESD sensing unit, and turning on a first discharging path according to the first trigger signal;
- a second discharging unit being coupled to the first terminal and a grounding terminal, and turning on a second discharging path to ground the first terminal when the second discharging unit receives a second trigger signal that is generated by the ESD sensing unit sensing the electrical changes at the first and the second terminals; and
- a third discharging unit being coupled to the first and the second terminals, and turning on a third discharging path to make the first and the second terminals short-circuited when the third discharging unit receives a third trigger signal that is generated by the ESD sensing unit sensing the electrical changes at the first and the second terminals,
- wherein the first discharging unit is coupled to the second terminal and the grounding terminal, and grounds the second terminal by turning on the first discharging path according to the first trigger signal.

6. The ESD protection circuit of claim 5, wherein the first trigger signal, the second trigger signal and the third trigger signal are one and the same.

7. The ESD protection circuit of claim 5, wherein the first trigger signal, the second trigger signal and the third trigger signal are different signals.

8. The ESD protection circuit of claim 1, wherein the first discharging unit is selected from at least one of the follows: at least one metal-oxide-semiconductor field-effect transistor; at least one bipolar junction transistor; and at least one silicon-controlled rectifier.

9. The ESD protection circuit of claim 5, wherein the first terminal and the second terminal of the differential-pair circuit are terminals for receiving a differential signal.

* * * * *